US005576895A

United States Patent [19]
Ikeda

[11] Patent Number: 5,576,895
[45] Date of Patent: Nov. 19, 1996

[54] APPARATUS FOR HOLDING A LENS BARREL FOR PROVIDING ACCURATE LENS ADJUSTMENT REGARDLESS OF ENVIRONMENTAL CONDITIONS

[75] Inventor: Masatoshi Ikeda, Tokyo, Japan

[73] Assignee: Nikon Corporation, Tokyo, Japan

[21] Appl. No.: 225,963

[22] Filed: Apr. 8, 1994

[30] Foreign Application Priority Data

Apr. 14, 1993 [JP] Japan .................................. 5-087270

[51] Int. Cl.$^6$ ...................................... G02B 7/02
[52] U.S. Cl. ....................... 359/811; 359/820; 359/819
[58] Field of Search ............................... 359/819, 811, 359/820, 803, 808, 809, 812, 818

[56] References Cited

U.S. PATENT DOCUMENTS

| | | | |
|---|---|---|---|
| 1,417,326 | 5/1922 | Jacobsson | 359/820 |
| 2,444,457 | 7/1948 | Marks et al. | 88/57 |
| 3,782,809 | 1/1974 | Shropshire | 359/819 |
| 3,941,460 | 3/1976 | Meginnis | 359/819 |
| 3,942,881 | 3/1976 | Meginnis | 359/819 |
| 4,589,744 | 3/1986 | Kimura | 359/819 |
| 4,699,505 | 10/1987 | Komoriya et al. | 355/30 |
| 5,137,349 | 8/1992 | Taniguchi et al. | 353/122 |

FOREIGN PATENT DOCUMENTS

| | | |
|---|---|---|
| 0585687 | 3/1994 | European Pat. Off. . |
| 1928861 | 1/1970 | Germany . |
| 1572729 | 2/1970 | Germany . |

OTHER PUBLICATIONS

Soviet Patent Abstracts, Section PQ, Week 9339, 17 Nov. 1994, Derwent Publications Ltd., London, GB; Class P81, AN 93-310153, (SU-A-1 760 499).

*Primary Examiner*—Georgia Y. Epps
*Assistant Examiner*—Ricky Mack

[57] ABSTRACT

A lens barrel holding apparatus for fixing a lens barrel having at least one optical element. The apparatus fixes a lens barrel to a lens barrel holding bed. The lens barrel has a flange portion formed along the circumferential direction of the outer peripheral portion of the lens barrel. The lens barrel holding bed has a cylindrical recess of a diameter larger than the outer diameter of the flange portion. The apparatus includes a plurality of bar-like first supporting members for coupling the bottom surface of the recess and the flange portion together. Also included is a second supporting member that has at least three bar members disposed on the upper part of the flange portion along the circumferential direction of the flange portion so as to surround the lens barrel. The at least three bar members are coupled to the flange portion and to the lens barrel holding bed.

14 Claims, 4 Drawing Sheets

APPARATUS FOR HOLDING A LENS BARREL FOR PROVIDING ACCURATE LENS ADJUSTMENT REGARDLESS OF ENVIRONMENTAL CONDITIONS

BACKGROUND OF THE INVENTION

1. Field of the Invention

The present invention relates to an apparatus for holding a lens barrel for a projection optical system used in an exposing apparatus or the like for the manufacture of semiconductive elements.

2. Description of the Related Art

In a projection exposing apparatus for manufacturing semiconductive elements, the image of a pattern of a mask is projected onto a photosensitive substrate (e.g., a wafer) maintained on a stage through a projection optical system. The stage for holding the wafer is held on a fixed board (i.e., a base portion).

The projection optical system includes a refracting system, a reflecting system or a catadioptric system comprising a combination of the two, and also includes a plurality of optical elements (e.g., a lens, a mirror, a concave mirror, etc.). Usually, a lens barrel for holding the projection optical system is fixed to a lens barrel holding bed, which is coupled to the aforementioned base portion so as to be spaced apart by a predetermined spacing in the direction of the optical axis of the projection optical system. The structure of such a projection exposing apparatus is disclosed, for example, in U.S. Pat. 5,137,349.

FIGS. 5A and 5B of the accompanying drawings show a prior art apparatus for fixing the lens barrel of a projection optical system to a lens barrel holding bed. In particular, the lens barrel 40 is provided with a projection optical system. Although only one lens L is shown in FIG. 5A, the lens barrel is actually provided with a plurality of lenses. Furthermore, lens barrel 40 is formed with a flange portion 44 substantially orthogonal to the optical axis 41 of the projection optical system and protruding from the substantially central portion of the lens barrel 40.

Also, lens barrel holding bed 42 is formed with a through hole 45 into which lens barrel 40 is loosely inserted.

As shown in FIG. 5B, flange portion 44 of lens barrel 40 is placed on the supporting portion 42a of the lens barrel holding bed 42, and the flange portion 44 and the lens barrel holding bed 42 are fastened by means of bolts 43, whereby the lens barrel 40 is mounted on the lens barrel holding bed 42.

In the prior art described above, the lens barrel usually is mounted on the lens barrel holding bed while the environmental temperature is controlled to be a predetermined temperature.

However, the lens barrel and the lens barrel holding bed are formed of different materials and therefore, when for example, the environmental temperature changes due to the transportation or the like of the exposing apparatus, the lens barrel and the lens barrel holding bed make expansion and contraction differing by the difference between the coefficients of linear expansion of the respective materials.

Accordingly, when as in the prior art, the lens barrel is directly fastened and mounted on the lens barrel holding bed by means of bolts, if the environmental temperature changes, internal stress will be created in the lens barrel by the fastening of the bolts. The use of bolts has led to a problem that the optical performance of the projection optical system provided in the lens barrel is aggravated by such interval stress. However, the aggravation of the optical performance herein referred to so is that the imaging accuracy of the projection optical system is aggravated by the deviation of the optical axes of the optical elements in the lens barrel or variations in the refractive indices of the optical elements.

SUMMARY OF THE INVENTION

The present invention has been made in view of the above-noted problems peculiar to the prior art and an object thereof is to provide a lens barrel holding apparatus which does not affect the optical performance of a projection optical system provided in a lens barrel and which can stably hold the lens barrel.

The lens barrel holding apparatus according to the present invention, as shown, for example, in FIGS. 1A and 1B of the accompanying drawings, is a lens barrel holding apparatus for fixing a lens barrel 1 holding at least one optical element to a lens barrel holding bed 2 for holding the lens barrel, the lens barrel 1 having a flange portion 6 formed along the circumferential direction of the outer peripheral portion of the lens barrel, the lens barrel holding bed 2 having a cylindrical recess of a diameter larger than the outer diameter of the flange portion 6.

More particularly, the aforementioned lens barrel holding apparatus includes, but is not limited to, a plurality of bar-like first supporting members 9 for coupling the bottom surface 2b of the recess and the flange portion 6 together, a second supporting member 5 comprising at least three bar members disposed on the upper part of the flange portion 6 along the circumferential direction of the flange portion so as to surround the lens barrel 1. The at least three bar members being coupled to the flange portion 6 and the lens barrel holding bed 2.

According to the present invention, the lens barrel is mounted on the lens barrel holding bed through the first supporting members and the second supporting members and therefore, the deformation difference between the lens barrel and the lens barrel holding bed caused by any variation in the environmental temperature is absorbed by the flexing of the bar-like supporting members.

Additionally, the lens barrel holding apparatus according to the present invention, as shown, for example, in FIGS. 2A and 2B of the accompanying drawings, is a lens barrel holding apparatus for fixing a lens barrel 1 holding at least one optical element to a lens barrel holding bed 10 for holding the lens barrel 1, the lens barrel 1 having a flange portion 6 formed along the circumferential direction of the outer peripheral portion of the lens barrel, the lens barrel holding bed 10 having a supporting surface 11 for supporting said flange portion thereof.

More particularly, the aforementioned lens barrel holding apparatus includes, but is not limited to, a supporting member 5 comprising at least three bar members disposed on the upper part of the flange portion 6 along the circumferential direction of the flange portion 6 so as to surround the lens barrel 1 with the flange portion 6 supported on the supporting surface 11. The at least three bar members 3a being coupled to the flange portion 6 and the lens barrel holding bed 10.

Furthermore, the lens barrel holding apparatus according to the present invention, as shown, for example, in FIGS. 3A and 3B of the accompanying drawings, is a lens barrel holding apparatus for fixing a lens barrel 15 holding at least one optical element to a lens barrel holding bed 18 for holding the lens barrel 15, the lens barrel 15 having a flange portion 17 formed along the circumferential direction of the outer peripheral portion of the lens barrel, the lens barrel holding bed 18 having a supporting surface for supporting the flange portion 17 thereon.

More particularly, the aforementioned lens barrel holding apparatus includes, but is not limited to, a plurality of bar-like supporting members 20 extending vertically upwardly from the supporting surface so as not to contact with the flange portion 17, and a coupling member 19 provided on the upper surface of the flange portion 17 and coupled to the supporting members 20 with the flange portion 17 supported on the supporting surface.

Additionally, the lens barrel holding apparatus of the present invention, as shown, for example, in FIGS. 3A and 3B of the accompanying drawings, is a lens barrel holding apparatus for fixing the lens barrel 15 of a projection optical system provided in a projection exposing apparatus for exposing the pattern of a mask onto a photosensitive substrate and projecting the image of the pattern onto the photosensitive substrate to a lens barrel holding bed 18 for holding the lens barrel 15, the lens barrel 15 having a flange portion 17 formed along the circumferential direction of the outer peripheral portion of the lens barrel, the lens barrel holding bar 18 having a supporting surface for supporting the flange portion 17.

More particularly, the above-described lens barrel holding apparatus includes, but is not limited to, a plurality of bar-like supporting members 20 extending vertically upwardly from the supporting surface so as not to contact with the flange portion 17, and a coupling member 19 provided on the upper surface of the flange portion 17 and coupled to the supporting members 20 with the flange portion 17 supported on the supporting surface.

In the present invention, the lens barrel is mounted on the lens barrel holding bed through the supporting members and therefore, the difference in expansion and contraction between the lens barrel and the lens barrel holding bed caused by any variation in the environmental temperature is absorbed by the bar-like supporting members flexing, and no internal stress is created in the lens barrel.

DETAILED DESCRIPTION OF THE PREFERRED EMBODIMENTS

Figure 1A:
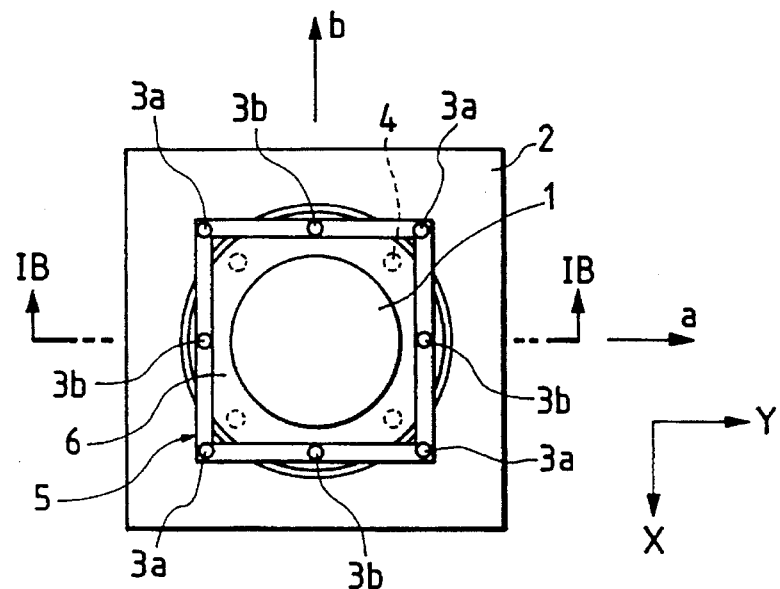
FIG. 1A is a plan view showing a first embodiment of the present invention.
Figure 1B:
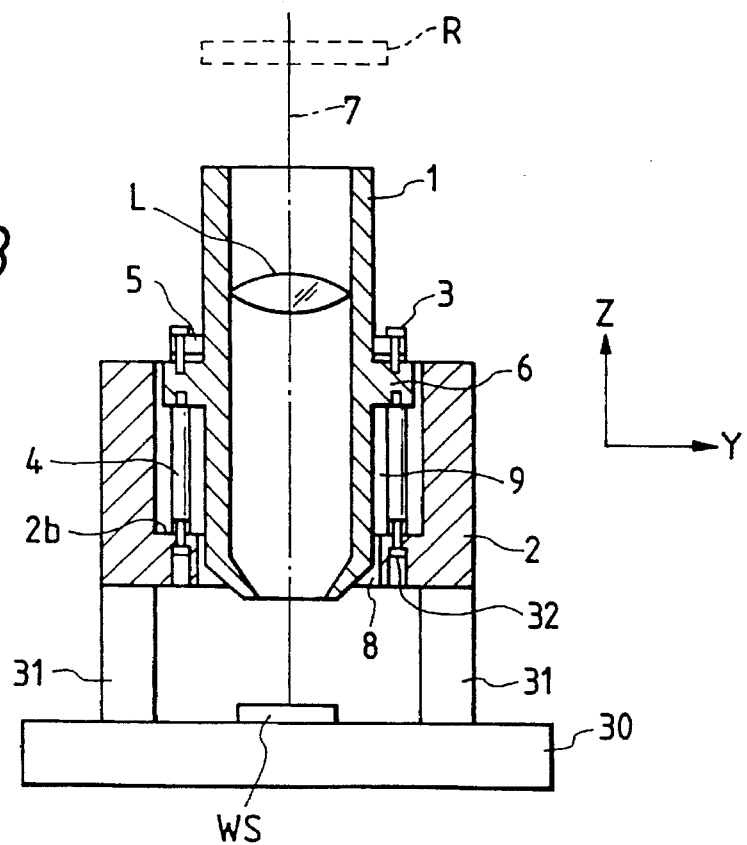
FIG. 1B is a cross-sectional view taken along the arrow IB of FIG. 1A.

FIG. 1A is a plan view showing a first embodiment of the lens barrel holding apparatus of the present invention, and FIG. 1B is a cross-sectional view taken along the arrow IB of FIG. 1A. The lens barrel holding apparatus of the present invention is incorporated in a projection exposing apparatus for the manufacture of semiconductive elements.

In FIG. 1B, a stage WS holding a photosensitive substrate thereon is moved two-dimensionally on a base 30. A lens barrel 1 holds a projection optical system comprising a plurality of lens units. In FIG. 1B, only one lens L is shown and the other lenses are not shown. This lens barrel 1 is held on a lens barrel holding bed 2. The lens barrel holding bed 2 and the base 30 are coupled together by coupling members 31 so as to be spaced apart from each other by a predetermined spacing in a z-direction. A mask (reticle) R is held above the lens barrel 1 by a reticle holder (not shown). The projection optical system projects a pattern formed on the reticle R onto the photosensitive substrate maintained on stage WS. The reticle R is disposed so that the center point of the reticle R and an optical axis 7 may intersect each other.

As shown in FIG. 1B, the lens barrel 1 is formed with a flange portion 6 substantially orthogonal to the optical axis 7 of the projection optical system and protruding from the substantially central portion of the lens barrel 1. The lens barrel holding bed 2 is of a cylindrical shape and the diameter of the cylindrical interior 9 thereof is large enough to permit the flange portion 6 of the lens barrel 1 to be loosely inserted therein. Furthermore, a through hole 8 into which the lens barrel 1 may be loosely inserted is formed in the bottom surface of the lens barrel holding bed 2. The lens barrel 1 and the lens barrel holding bed 2 in the present invention are formed of different materials.

A description will now be made of the supporting unit for mounting the lens barrel 1 on the lens barrel holding bed 2.

The supporting unit is comprised of stud bolts 4 (e.g., bar-like members) and a supporting member 5.

Each stud bolt 4 (in the present embodiment, four such bolts are used) has one end thereof mounted on the inner bottom surface 2b of the lens barrel holding bed 2 by ways of bolts 32, as shown in FIG. 1B. Stud bolts 4 are disposed at intervals of about 90° on the circumference of the inner bottom surface 2b about the optical axis 7. The other end of each stud bolt 4 is threadably engaged with the flange portion 6 of the lens barrel 1. The lens barrel 1 is fixed to the lens barrel holding bed 2 by stud bolts 4.

The supporting member 5, as shown in FIG. 1A, is in the form of a square frame comprising a combination of four bars. The opposite ends of the bars are fixed to the lens barrel holding bed 2 by four bolts 3a, and the central portions of the bars are fixed to the flange portion 6 of the lens barrel 1 by four bolts 3b. In FIG. 1A, the opposite ends of each bar are superposed upon the ends of other bar to thereby form a polygonal frame, but may form a regular polygon on the lengthwise extension of each bar without being superposed.

The presently preferred first embodiment utilizes the rigidity characteristic of the stud bolts 4 and the supporting member 5. That is, the stud bolts 4 and the supporting member 5 are bars and therefore have the rigidity characteristic that they are strong in the rigidity to a load applied in a direction parallel to the lengthwise direction of the bars and are weak in the rigidity to a load applied in a direction perpendicular to the lengthwise direction of the bars, and the present embodiment utilizes such rigidity characteristic.

Accordingly, the lens barrel 1 is displaced in a Z-direction which displacement is suppressed by the rigidity characteristic of the stud bolts 4. Also, the stud bolts 4 flex relatively freely for the displacement of the lens barrel 1 in the X- and Y-directions. Also, the lens barrel 1 has its displacement in the circumferential direction of the flange portion 6 suppressed by the rigidity characteristic of the supporting member 5. The supporting member 5 flexes relatively freely for the displacement of the flange portion 6 in the Z-direction and in the radial direction.

In the first embodiment, when any variation in the environmental temperature occurs to the lens barrel 1 and the lens barrel holding bed 2, the lens barrel 1 and the lens barrel holding bed 2 make expansion and contraction conforming to the coefficients of linear expansion of their materials.

However, the lens barrel 1 is mounted on the lens barrel holding bed 2 through the supporting units 4, 5 and therefore can expand and contract without any internal stress being created therein.

That is, the supporting units 4, 5 are designed to be displaced, in other words, flex, in the radial direction of FIG. 1A (a direction "a" and a direction "b") to thereby absorb any difference in expansion and contraction between the lens barrel 1 and the lens barrel holding bed 2 caused by any variation in the environmental temperature, thus supporting the lens barrel 1 so that the difference in expansion and contraction may not affect the lens barrel 1.

Accordingly, the condition of the supporting units 4, 5, particularly the supporting member 5 forming the frame, is such that the rigidity of the supporting member 5 need be weaker than the rigidity of the lens barrel 1 and the lens barrel holding bed 2 in the radial direction which are expanded and contracted by the influence of environment temperature. Also, the coefficient of linear expansion of the supporting member 5 may be substantially the same as the coefficient of linear expansion of the lens barrel holding bed 2. The aforementioned construction may be configured for preventing any internal stress from being created in the lengthwise direction of each bar of the supporting member 5 by the expansion of the lens barrel holding bed 2, i.e., an increase in the diameter of the cylindrical interior 9.

Also, in the presently preferred first embodiment, any difference in expansion and contraction between the lens barrel 1 and the lens barrel holding bed 2 created by any variation in the environmental temperature is absorbed by the stud bolts 4 and the supporting member 5 of the supporting units flexing and therefore, there is no influence of a frictional force among the lens barrel 1, the lens barrel holding bed 2 and the supporting units 4, 5. Accordingly, the lens barrel 1 after the environmental temperature has varied is maintained in the position before the environmental temperature varies, by the resilient force of the supporting member 5 after it is displaced. That is, the axis of the lens barrel 1 is centered. Accordingly, substantially no irregularity occurs between the optical axis 7 of the lens barrel 1 and the center of reticle R.

In the present embodiment, four stud bolts 4 (supporting members) are used, but the greater the number of the stud bolts, the more is dispersed the load supporting the lens barrel 1 and therefore, the more is dispersed the flexure of the lens barrel 1 itself.

Figure 2A:
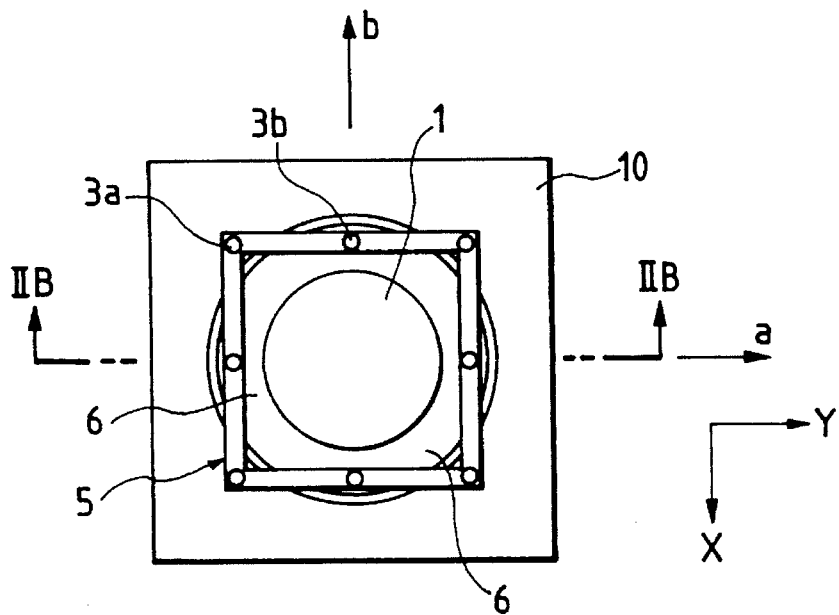
FIG. 2A is a plan view showing a second embodiment of the present invention.
Figure 2B:
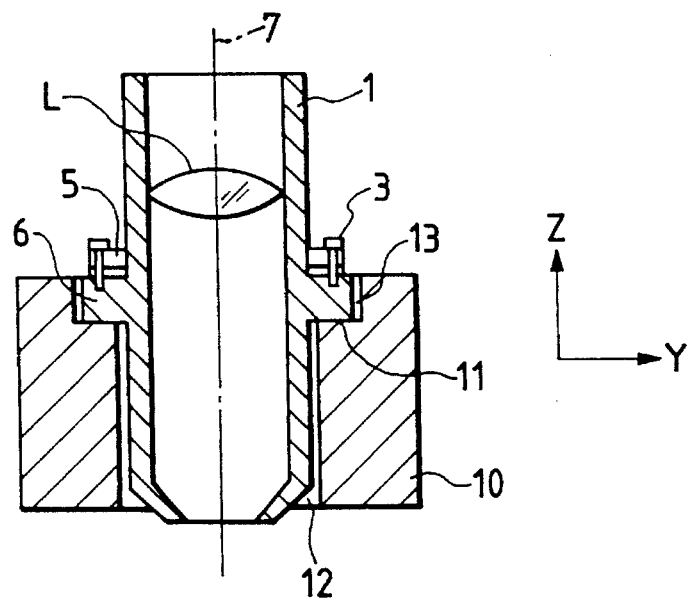
FIG. 2B is a cross-sectional view taken along the arrow IIB of FIG. 2A.

Description will now be made of a second embodiment of the lens barrel holding apparatus of the present invention. FIG. 2A is a plan view showing the second embodiment, and FIG. 2B is a cross-sectional view taken along the arrow IIB of FIG. 2A. As shown in FIG. 2B, the second embodiment is an embodiment in which the stud bolts of the first embodiment are eliminated. Additionally, FIG. 2B is a view corresponding to FIG. 1B used for the description of the previous first embodiment, and in FIG. 2B, the reticle R, the wafer stage WS, etc. are now shown. Also, in the second embodiment, components similar to those in the first embodiment are given similar reference numerals and need not be described.

A lens barrel holding bed 10 is formed with a through hole 12 into which the lens barrel 1 is loosely inserted, and a groove (supporting portion) 13 concentric with the through hole 12 and having a diameter larger than the outer diameter of the flange portion 6.

The depth of the supporting portion 13 is of such a degree that which the flange portion 6 is placed on the supporting portion 13, the level of the upper surface of the lens barrel holding bed 10 and the level of the upper surface of the flange portion 6 become substantially the same.

The lens barrel 1 is inserted into the lens barrel holding bed 10 until the flange portion 6 of the lens barrel 1 is placed on the supporting portion 13 of the lens barrel holding bed 10.

After the flange portion 6 is placed on the supporting portion 13, the lens barrel 1 is mounted on the lens barrel holding bed 10 by ways of the supporting member 5.

The supporting member 5 in the second embodiment is similar in construction to the supporting member 5 in the first embodiment. Accordingly, the supporting member 5 flexes relatively freely for the displacement of the flange portion 6 in a z-direction direction and in the radial direction. Also, the displacement of the flange portion 6 in the circumferential direction is suppressed by the supporting member 5.

When the lens barrel 1 is mounted on the lens barrel holding bed 10 as described above, any difference in expansion and contraction between the lens barrel 1 and the lens barrel holding bed 10 caused by any variation in the environmental temperature is absorbed by the supporting member 5 flexing in the radial direction of FIG. 2A (a direction "a" and a direction "b").

However, a frictional force is created between the lens barrel 1 and the lens barrel holding bed 10. Thus, any such frictional forces become resistance forces when the supporting member 5 moves the lens barrel 1 relative to the lens barrel holding bed 10. By such resistance force, irregularity is created between the optical axis of the lens barrel 1 after the environmental temperature has varied and the center of the reticle.

The irregularity, however, will pose no problem if it is within the allowable value of the specification of the exposing apparatus.

Accordingly, the second preferred embodiment has an advantage over the embodiments that the structure thereof can be simplified if the aforementioned irregularity is within the allowable value of the specification of the exposing apparatus.

In the above-described first and second embodiments, the opposite ends of each of the bars are fixed to the lens barrel holding bed and the central portion of each of the bars is fixed to the flange portion. Alternatively, one end of each bar may be fixed to the lens barrel holding bed and the other end may be fixed to the flange portion.

Furthermore, the supporting member in the first and second embodiments is a square frame comprising four bars, but alternatively, it may be a triangular frame comprising three bars, or a regular polygonal frame comprising five or more bars.

Figure 3A:
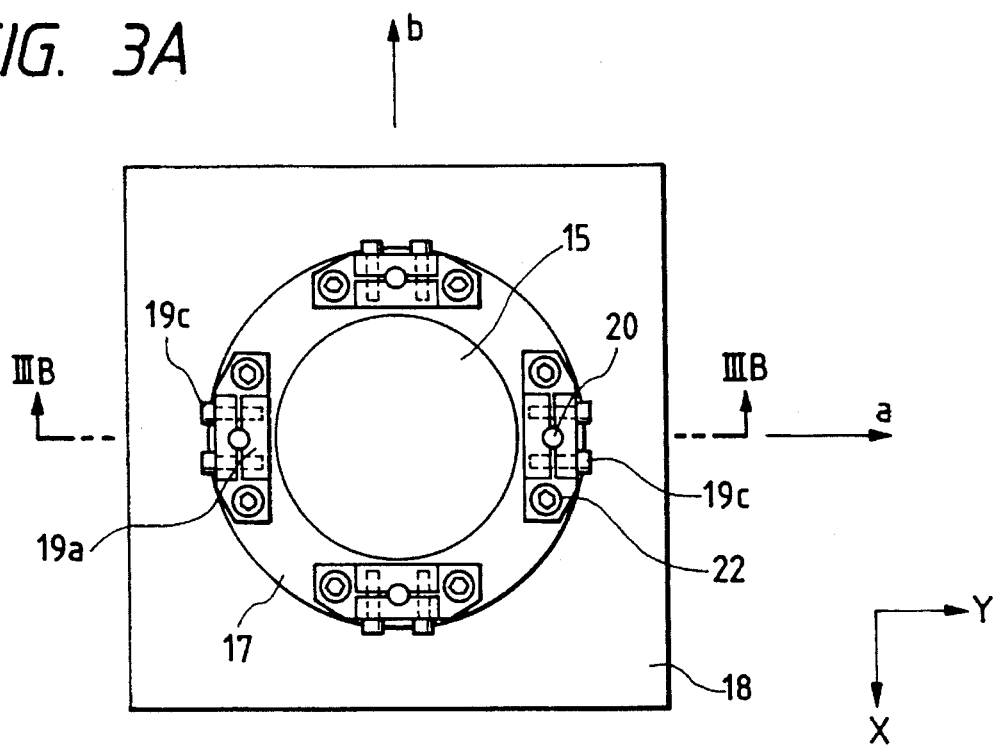
FIG. 3A is a plan view showing a third embodiment of the present invention.
Figure 3B:
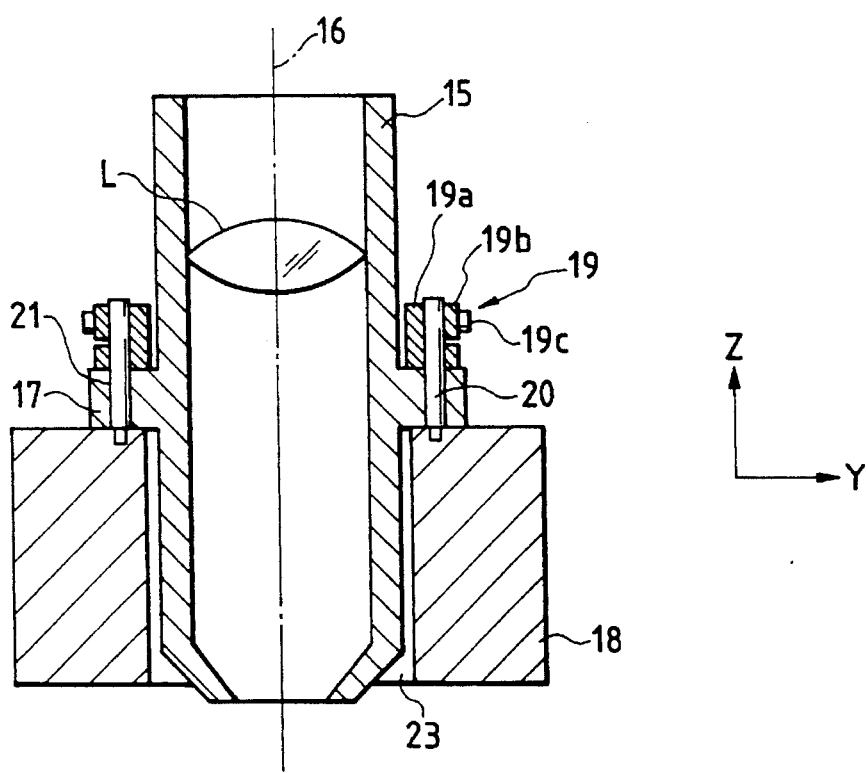
FIG. 3B is a cross-sectional view taken along the arrow IIIB of FIG. 3A.

FIG. 3A is a plan view showing a third preferred embodiment of the present invention, and FIG. 3B is a cross-sectional view taken along the arrow IIIB of FIG. 3A. A lens barrel 15 holds a projection optical system comprising a plurality of lens units. In FIG. 3B, only one lens L is shown and the other lenses are not shown. The lens barrel 15 is held on a lens barrel holding bed 18. Also, FIG. 3B is a view corresponding to FIG. 1B used for the description of the previous first embodiment, and in FIG. 3B, the reticle R, the wafer stage WS, etc. are not shown.

The lens barrel 15 is formed with a flange portion 17 substantially orthogonal to the optical axis 16 of the projection optical system and protruding from the substantially central portion of the lens barrel 15.

The flange portion 17 formed on the lens barrel 15 is provided with four through holes 21 extending in a direction parallel to the optical axis 16. These through holes 21 are disposed at intervals of about 90° on the circumference of the flange portion 17 about the optical axis 16. Furthermore, the flange portion 17 is provided with split blocks 19 near the respective through holes 21.

With reference to FIG. 3B, the lens barrel holding bed 18 is formed with a through hole 23 into which the lens barrel 15 is loosely inserted. The lens barrel 15 is inserted until the flange portion 17 of the lens barrel 15 is placed on the lens barrel holding bed 18.

Moreover, four bolts 20 each have one end thereof fixed to the lens barrel holding bed 18. In the present preferred embodiment, the lens barrel holding bed 18 is internally threaded, and the external threads of the bolts 20 are engaged with the internal thread. Also, each bolt 20 has a diameter smaller than the through holes 21 formed in the flange portion 17. Accordingly, when the bolts 20 are fitted into the through holes 21 of the flange portion 17, a gap is formed between each through hole 21 and each bolt 20.

Figure 4:
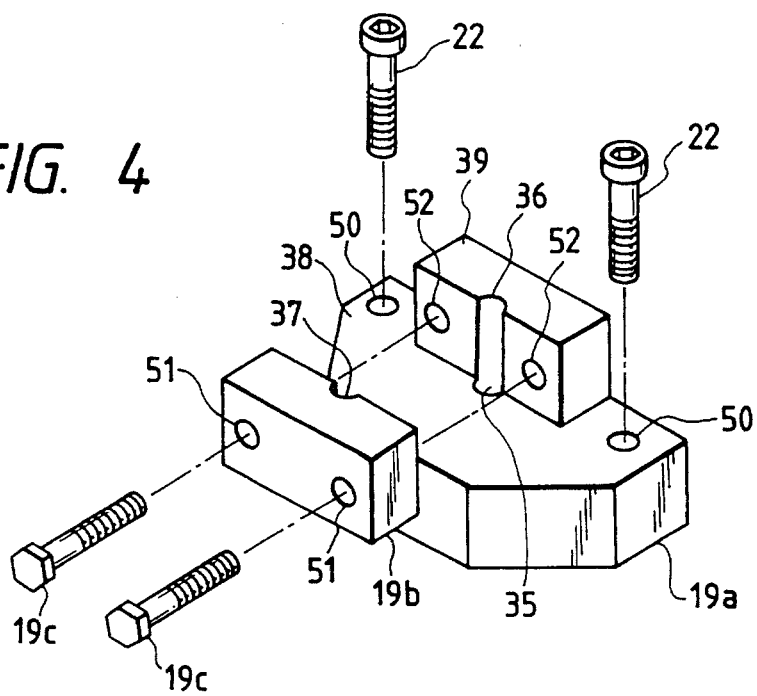
FIG. 4 is a perspective view showing the construction of a split block.
Figure 5A:
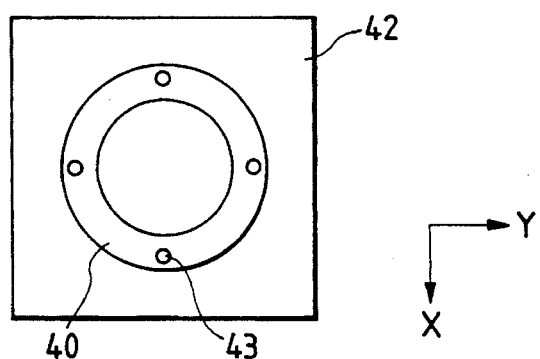
FIG. 5A is a plan view showing a lens barrel holding apparatus according to the prior art.
Figure 5B:
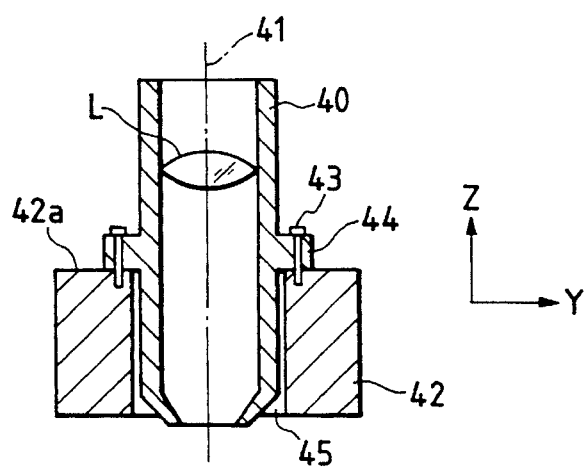
FIG. 5B is a cross-sectional view showing the lens barrel holding apparatus according to the prior art.

With reference to FIG. 4, the split block 19 is now described. The split block 19 includes a block body 19a fixed to the flange portion 17, a movable portion 19b movable relative to the block body 19a, and keep-screws 19c for effecting the movement and fastening of the movable portion 19b. Also, the block body 19a comprises a mount portion 38 mounted on the flange portion, and a keep portion 39 on the upper part of the mount portion 38. This keep portion 39 is a cube and is a member for keeping and stabilizing the bolts 20. Also, the block body 19a is formed with through holes through which bolts 20 extend. These through holes are each a circular opening 35 in the mount portion 38 and an arcuate groove portion 36 in the keep portion 39. The diameter of the circular opening 38 is larger than the diameter of the bolts 20. Also, the arcuate groove 36 is an arc which is somewhat less than a semicircle. Furthermore, the movable portion 19b is formed with a groove 37 of the same shape as the groove formed in the keep portion 39.

Also, the mount portion 38 is formed with circular openings 50, through which keep screws 22 are threadably engaged with internal threads formed in the flange portion. The movable portion 19 is also formed with circular openings 51, through which the keep screws 19c are threadably engaged with internal threads formed in the keep portion 39.

When lens barrel 15 is placed on the lens barrel holding bed 18, the four bolts 20 pass through the air holes 21 in the flange portion 17 and the circular opening 35 in the mount portion 38 to the portion of the groove 36. Block body 19a is position-adjusted so that the bolts 20 may be located in the central portion of the groove 36. The block body 19a is then fastened to the flange portion 17 by the keep screws 22. The movable portion 19b and the keep portion 39 are then coupled together by the keep screws 19c, and are fastened with the bolts 20 interposed between the groove 36 and the groove 37. Thus, the split block 19 and the bolts 20 are coupled together.

The above described and constructed third preferred embodiment utilizes the rigidity characteristic of the bolts 20. The rigidity characteristic is the characteristic that the bolts 20 are strong in the rigidity to a load applied in a direction parallel to the lengthwise direction of the bolts 20 and are weak in the rigidity to a load applied in a direction perpendicular to the lengthwise direction of the bolts 20.

Accordingly, the lens barrel 15 has its displacement in the Z-direction suppressed by the rigidity characteristic of the bolts 20, and is relatively free in its displacement in X- and Y-direction (including the circumferential direction and radial direction of the flange portion 17).

In the lens barrel holding apparatus of the third preferred embodiment, when any variation in the environmental temperature occurs, the lens barrel 15 and the lens barrel holding bed 18 make expansion and contraction conforming to the coefficients of linear expansion of their materials.

However, any difference in expansion and contraction caused between the lens barrel 15 and the lens barrel holding bed 18 is absorbed by the bolts 20. That is, the bolts 20 are displaced like parallel springs in the radial direction of FIG. 3A (a direction "a" and a direction "b"), thereby absorbing any difference in expansion and contraction caused between the lens barrel 15 and the lens barrel holding bed 18.

The bolts 20 need such a degree of softness than can absorb any difference in expansion and contraction caused between the lens barrel 15 and the lens barrel holding bed 18, and such a degree of resilient force that can center the lens barrel 15. Also, it is desirable that the coefficient of linear expansion of the bolts 20 be substantially the same as the coefficient of linear expansion of the lens barrel 15. Thus, the amount of expansion and contraction of the flange portion 17 in the Z-direction and the amount of expansion and contraction of bolts 20 in the Z-direction become equal to each other, and no stress is created in the bolts 20.

In the above-described third preferred embodiment, there is a frictional force between the flange portion 17 of the lens barrel 15 and the lens barrel holding bed 18. The frictional force provides a resistance during the centering of the lens barrel 15. Some irregularity may sometimes be created in the optical axis of the lens barrel 15 and the center of the reticle.

However, if the irregularity is within the allowable value or tolerances of the specification of the exposing apparatus, it will pose no problem.

The number of the bolts 20 and the number of the split blocks 19 are not limited to four, but may be three or more.

In each preferred embodiment of the present invention, no internal stress will be created in the lens barrel even if there is any variation in the environmental temperature and therefore, a desired optical performance of the lens barrel can be maintained.

Also, the present invention is generous to any variation in the environmental temperature and therefore, the option of the temperature used can be increased in the manufacture, transportation, preservation, operation, etc. of the exposing apparatus.

Finally, although a few preferred embodiments of the present invention have been shown and described, it will be appreciated by those skilled in the art that many changes may be made to such embodiments without departing from the principles and spirit of the invention, the scope of which is defined in the appended claims and equivalents thereof.

What is claimed is:

1. A lens barrel holding apparatus, comprising: a lens barrel holding bed having a cylindrical recess;

a lens barrel holding at least one optical element, said lens barrel being affixed to said lens barrel holding bed, said lens barrel having a flange portion formed along a circumferential direction of an outer peripheral portion of said lens barrel, said cylindrical recess of said lens barrel holding bed with a diameter larger than an outer diameter of said flange portion, and said flange portion being recessed in said cylindrical recess;

a plurality of bar-like first supporting members coupling the bottom surface of said recess and said flange portion together; and a second supporting member having at least three bar members disposed on the upper part of said flange portion along the circumferential direction of said flange portion so as to surround said lens barrel, said at least three bar members being coupled to said flange portion and said lens barrel holding bed.

2. An apparatus according to claim 1, wherein said at least three bar members are disposed in the form of a polygonal frame, the opposite end portions of each of said bar members and said lens barrel holding bed are coupled together, and the central portion of each of said bar members and said flange portion are coupled together.

3. An apparatus according to claim 2, wherein the coefficient of linear expansion of said second supporting member is substantially the same as the coefficient of linear expansion of said lens barrel holding bed.

4. A lens barrel holding apparatus, comprising: a lens barrel holding bed;

a lens barrel holding at least one optical element, said lens barrel being affixed to said lens barrel holding bed, said lens barrel having a flange portion formed along a circumferential direction of an outer peripheral portion of said lens barrel, and said lens barrel holding bed having a supporting surface for supporting said flange portion;

a supporting member including at least three bar members disposed on the upper part of said flange portion along the circumferential direction of said flange portion so as to surround said lens barrel with said flange portion supported on said supporting surface, said at least three bar members being coupled to said flange portion and said lens barrel holding bed.

5. An apparatus according to claim 4, wherein said at least three bar members are disposed in the form of a polygonal frame, the opposite end portions of each of said bar members and said lens barrel holding bed are coupled together, and the central portion of each of said bar members and said flange portion are coupled together.

6. An apparatus according to claim 5, wherein the coefficient of linear expansion of said supporting member is substantially the same as the coefficient of linear expansion of said lens barrel holding bed.

7. A lens barrel holding apparatus, comprising: a lens barrel holding bed;

a lens barrel holding at least one optical element, said lens barrel being affixed to said lens barrel holding bed, said lens barrel having a flange portion formed along a circumferential direction of an outer peripheral portion of said lens barrel, and said lens barrel holding bed having a supporting surface for supporting said flange portion thereon;

a plurality of bar-like supporting members extending vertically upward from said supporting surface so as not to contact with said flange portion; and coupling means for coupling said supporting members with said flange portion supported on said supporting surface, said coupling means provided on the upper surface of said flange portion.

8. An apparatus according to claim 7, wherein said flange portion has through holes through which said supporting members extend, and said coupling means is coupled to said supporting members extending through said flange portion and protruding from the upper surface of said flange portion.

9. An apparatus according to claim 8, wherein said coupling means comprises first block bodies and second block bodies, said first block bodies being fixed to said flange portion by several bolts, said second block bodies being coupled to said first block bodies by several bolts with said supporting members interposed therebetween.

10. An apparatus according to claim 9, wherein the coefficient of linear expansion of said supporting members is substantially the same as the coefficient of linear expansion of said lens barrel.

11. A lens barrel holding apparatus, comprising: a lens barrel holding bed;

a lens barrel of a projection optical system provided in a projection exposing apparatus for exposing a pattern of a mask onto a photosensitive substrate and projecting an image of said pattern onto the photosensitive substrate, said lens barrel being affixed to said lens barrel holding bed, said lens barrel having a flange portion formed along a circumferential direction of an outer peripheral portion of said lens barrel, and said lens barrel holding bed having a supporting surface for supporting said flange portion thereon;

a plurality of bar-like supporting members extending vertically upward from said supporting surface so as not to contact with said flange portion; and coupling means for coupling said supporting members with said flange portion supported on said supporting surface, said coupling means provided on the upper surface of said flange portion.

12. An apparatus according to claim 11, wherein said flange portion has through holes through which said supporting members extend, and said coupling means is coupled to said supporting members extending through said flange portion and protruding from the upper surface of said flange portion.

13. An apparatus according to claim 12, wherein said coupling means comprises first block bodies and second block bodies, said first block bodies being fixed to said flange portion by several bolts, said second block bodies being coupled to said first block bodies by several bolts with said supporting members interposed therebetween.

14. An apparatus according to claim 13, wherein the coefficient of linear expansion of said supporting members is substantially the same as the coefficient of linear expansion of said lens barrel.

\* \* \* \* \*